(12) United States Patent
Romanov et al.

(10) Patent No.: US 7,821,278 B2
(45) Date of Patent: Oct. 26, 2010

(54) METHOD AND DEVICE FOR TESTING OF NON-COMPONENTED CIRCUIT BOARDS

(75) Inventors: Victor Romanov, Wertheim (DE); Uwe Rothaug, Marktheidenfeld (DE)

(73) Assignee: atg Luther & Maelzer GmbH, Wertheim/Reicholzheim (DE)

( * ) Notice: Subject to any disclaimer, the term of this patent is extended or adjusted under 35 U.S.C. 154(b) by 164 days.

(21) Appl. No.: 12/097,819

(22) PCT Filed: Jan. 26, 2007

(86) PCT No.: PCT/EP2007/000690
§ 371 (c)(1),
(2), (4) Date: Jun. 17, 2008

(87) PCT Pub. No.: WO2007/090528
PCT Pub. Date: Aug. 16, 2007

(65) Prior Publication Data
US 2008/0272792 A1    Nov. 6, 2008

(30) Foreign Application Priority Data
Feb. 8, 2006    (DE) .................. 10 2006 005 800

(51) Int. Cl.
*G01R 31/02* (2006.01)
(52) U.S. Cl. .................................... 324/758
(58) Field of Classification Search .......... 324/158.1, 324/754–765; 356/237.4–237.5
See application file for complete search history.

(56) References Cited

U.S. PATENT DOCUMENTS 5,113,133 A    5/1992    Conti et al.
5,268,645 A    12/1993   Prokoff et al.
5,596,283 A    1/1997    Mellitz et al.

(Continued)

FOREIGN PATENT DOCUMENTS

DE    40 12 839 A1    10/1990

(Continued)

OTHER PUBLICATIONS

Chestney, J.A., et al., "Control and Integration Techniques in a Fully Automated Manufacturing Cell for Carbon Composites," IEE Proceedings: Control Theory and Applications, IEE, Stevenage, Herts, BG, vol. 143, No. 2, pp. 159-163, Mar. 1, 1996.

(Continued)

*Primary Examiner*—Ha T. Nguyen
*Assistant Examiner*—Joshua Benitez
(74) *Attorney, Agent, or Firm*—Houston Eliseeva, LLP

(57) ABSTRACT

The invention relates to a method and a device for the testing of noncomponented circuit boards.

The method according to the invention is used to determine deviations of circuit board test points of a series of circuit boards from the CAD data relating to these circuit boards, by scanning the surface of the circuit board by an imaging method and subjecting this image to automatic image analysis so that it may be compared with the CAD data. The CAD data are then suitably corrected so that, with the aid of the corrected CAD data, the circuit board may be tested in a finger tester, with test fingers of the finger tester being controlled on the basis of the deviations found.

36 Claims, 5 Drawing Sheets

U.S. PATENT DOCUMENTS

| | | | |
|---|---|---|---|
| 5,625,297 | A | 4/1997 | Arnaudov et al. |
| 5,804,982 | A | 9/1998 | Lo et al. |
| 5,977,776 | A | 11/1999 | Huth et al. |
| 6,344,751 | B1 | 2/2002 | Prokopp et al. |
| 6,943,572 | B2 * | 9/2005 | Desplats et al. ............. 324/752 |
| 7,015,711 | B2 | 3/2006 | Rothaug et al. |
| 7,149,342 | B2 | 12/2006 | Biazik et al. |
| 7,190,182 | B2 | 3/2007 | Romanov |
| 7,457,455 | B2 * | 11/2008 | Matsui et al. ................ 382/149 |
| 7,538,564 | B2 * | 5/2009 | Ehrmann et al. ............ 324/752 |
| 7,554,352 | B2 * | 6/2009 | Huie .......................... 324/765 |
| 7,656,170 | B2 * | 2/2010 | Pinto et al. .................. 324/751 |
| 7,665,049 | B2 * | 2/2010 | Muranaka ...................... 716/4 |
| 2004/0027149 | A1 * | 2/2004 | Aitren et al. ................. 324/765 |
| 2007/0159192 | A1 * | 7/2007 | Hasegawa et al. ........... 324/754 |

FOREIGN PATENT DOCUMENTS

| | | |
|---|---|---|
| DE | 41 34 193 A1 | 10/1992 |
| DE | 42 21 075 A1 | 1/1993 |
| DE | 197 03 982 A1 | 8/1998 |
| DE | 101 60 119 A1 | 10/2003 |
| EP | 0 468 153 A1 | 1/1992 |
| EP | 0 853 242 A1 | 7/1998 |
| EP | 0 989 409 A1 | 3/2000 |
| TW | 356522 | 4/1999 |
| WO | 92/11541 A1 | 7/1992 |
| WO | 01/91053 A1 | 11/2001 |
| WO | 03/096037 A1 | 11/2003 |

OTHER PUBLICATIONS

International Search Report from International Application No. PCT/EP2007/000690, filed Jan. 26, 2007, dated Jul. 18, 2007.

English translation of the International Preliminary Report on Patentablity dated Sep. 9, 2008, from International Application No. PCT/EP2007/000690, filed on Jan. 26, 2007.

* cited by examiner

METHOD AND DEVICE FOR TESTING OF NON-COMPONENTED CIRCUIT BOARDS

RELATED APPLICATIONS

This application claims priority to German Application No. DE 10 2006 005 800.3, filed on Feb. 8, 2006, which is incorporated herein by reference in its entirety.

BACKGROUND OF THE INVENTION

The present invention relates to a method and a device for the testing of non-componented circuit boards.

Devices for the testing of non-componented circuit boards may in principle be divided into two groups, namely finger testers and parallel testers. Parallel testers are test devices which, by means of an adapter, simultaneously contact all or at least the majority of contact points of a circuit board to be tested. Finger testers are testers, for the testing of non-componented or componented printed circuit boards, which scan the individual contact points in sequence or serially using two or more test fingers. Serial testing with a finger tester is, due to the principle on which it is based, slower than parallel testing with a parallel tester.

The test fingers are generally attached to a slide which may be moved along a cross-bar, while the cross-bar in turn is guided and able to move on guide rails. The slides may therefore be positioned at any desired point of a generally rectangular test array. Equally there are test devices with fixed cross-bars, on which slides are designed to move. Mounted on these slides are test fingers which are of a certain length and at one end are attached pivotably to the slide. Through the swivelling movement of the test finger, a certain area at right-angles to the cross-bar may be scanned. All circuit board test points of a circuit board to be tested may be contacted and thus tested by both types of finger tester.

A finger tester is described in EP 0 468 153 A1 and a method for the testing of circuit boards using a finger tester is described in EP 0 853 242 A1.

The key factor for the success of a finger tester on the market is the speed with which a circuit board to be tested can be tested. In order to accelerate this test rate, special test methods (e.g. EP 0 853 242 A1 and the corresponding U.S. Pat. No. 5,977,776) or special test probes (e.g. U.S. Pat. No. 5,804,982 and U.S. Pat. No. 6,344,751) have been developed. Such a test probe for the rapid contacting of a circuit board test point of a circuit board to be tested is disclosed by U.S. Pat. No. 5,113,133.

Disclosed by WO 92/11541 is an imaging system for a device for the testing of circuit boards. This imaging system has, like an X-Y recorder, a movable cross-bar on which is mounted a test head with a vertically movable test needle. Mounted next to the test needle is a camera comprising a lens and a CCD element. The image produced by the camera is displayed on a monitor. With the aid of the image shown on the screen, an operator may control the test head in such a way that—during a learning phase—it traces all contact points to be tested and programs the relevant coordinates. During the test the device traces the individual contact points automatically and contacts them with the test needle.

With this known device, therefore, the movement of the contact finger relative to a circuit board is learned with the aid of a camera. With current circuit boards this is practically no longer possible, since the circuit boards have so many circuit board test points, each of which must be contacted by a contact finger, that such a learning process can neither be completed within a reasonably economical period of time, nor can it be made without errors, due to the extent of the number of contacting processes. Consequently, in the case of current finger testers, the test fingers are controlled with the aid of CAD data of the circuit board to be tested. There are various formats for these CAD data, with the most widely used being the so-called Gerber data.

With conventional finger testers, so that the test fingers may be positioned correctly, two calibration processes are performed before the actual testing of the circuit board to be tested. In a first testing process the test heads, each comprised of a slide and a contact finger, are calibrated with reference to the tester, and in a second calibration process, the CAD data of a circuit board to be tested are brought into agreement with an actual circuit board inserted in the tester.

In the first calibration process a calibration plate is inserted in the tester. This calibration plate is a large circuit board on the surface of which a grid is formed by means of the conductor paths. The intersection points of the grid are contacted by the contact fingers. With the aid of these contacts, the respective position of the contact finger may be determined and the tester calibrated.

The second calibration process is generally performed for each circuit board to be tested. In this process, one circuit board of a batch is inserted in the tester and then, using the test fingers or a camera moving over the circuit board, prominent circuit board test points of the pattern of circuit board test points to be tested are detected and their position in the tester determined. When the circuit board test points have been detected, then the CAD data of the circuit board test points of the circuit board to be tested can be brought into agreement with the coordinates of the physical circuit board, i.e. the distortions and misalignments of the circuit board test point pattern typical for a batch are recorded and stored in memory.

When both calibration processes have been completed, then the circuit board test points of the circuit board to be tested may be successfully approached, and contacted by means of the test fingers.

Known from WO 03/096037 is a method in which, during the testing process, the contact tips are monitored by an optical detection unit. Movement of the contact tips is automatically corrected by means of the results determined by the optical detection unit, at least on approaching some of the circuit board test point of a circuit board to be tested, in such a way that the contact tip makes reliable contact with the relevant circuit board test point. In this way circuit board test points are contacted precisely, even when the relevant positioning data has not yet been calibrated or not yet precisely calibrated.

Calibration data may be calculated from the correction data provided by this process. These calibration data replace the two calibration processes usually undertaken with conventional finger testers, since they determine clearly the spatial relationship between the contact tips of the test fingers and the physical circuit board test points of the circuit board to be tested.

Also known, from DE 42 21 075 A1 and the corresponding U.S. Pat. No. 5,596,283 is a method of testing circuit boards in which a finger tester is provided with a device for aligning the circuit board with the measuring system.

This aligning device has a camera for detecting the circuit board. This is used to search for predetermined circuit components and/or structures via conductor paths and connections on the surface of the circuit board. These features and/or components of the circuit board are automatically localised, and an alignment transformation is made between the coordinate system of the circuit board and the coordinate of the movement system.

Using these known systems, therefore, precise positioning of the test fingers relative to the circuit board test points is obtained.

Known from DE 197 03 982 A1 is a method for the testing of circuit boards which is carried out with a finger tester. After placing a circuit board to be tested in the finger tester, the circuit board is optically scanned and the pattern of test points arranged on the circuit board is recorded. Any deviation from an ideal circuit board, ideally placed in the finger tester, is determined and a coordinate system of the finger tester is corrected on the basis of the deviation found. The test fingers of the finger tester are moved in accordance with the corrected coordinate system.

Despite these automatic calibration procedures it is still always necessary to correct manually the data for controlling the test fingers. Such manual correction is required since the circuit boards actually to be tested not only have deviations between the actual position of the individual circuit board test point and their required positions as preset by the CAD data, but also the individual circuit board test points sometimes occur in a different form or a different type (pad field or plated-through hole) from that shown in the CAD data. This is a problem which will continue to exist for at least as long as multi-layer circuit boards are made. For in the production of multi-layer circuit boards, the original CAD data which define the while circuit board are converted into several separate construction drawings for the individual layers. These construction drawings for the individual layers are often produced in a different data format from the CAD data describing the whole circuit board. In the course of data conversion, inaccuracies may occur. In addition, changes are sometimes made by production specialists, in which for example SMD pads are replaced by plated-through holes and vice-versa, in order to simplify the production of a circuit board. As a rule, though, these changes are not entered into the CAD data describing the whole circuit board. Also, for technical production reasons, the pattern used in application of the solder resist to the individual layers is sometimes changed. This may affect the testing of circuit boards in particular if solder resist on the outer surface of a circuit board is changed, since this can change the shapes of the individual circuit board test point, in particular the pad fields. Thus it sometimes happens that rectangular SMD pad fields are changed into circular SMD pad fields, or elongated strip-like pad fields are changed into e.g. rectangular SMD pad fields.

These deviations from the specified CAD data of a specific circuit board type to be tested make it necessary to adjust manually the control data of a finger tester for each type of circuit board and for each batch of circuit boards.

In practice, a test is first of all made without manual adjustment. When problems occur, which is generally the case, the problem points are manually identified and suitably corrected. Until all problem points have been dealt with, this process must be repeated several times. Depending on the complexity of the circuit board type, this may take from several hours up to a whole day. If, instead of pad fields, plated-through holes are formed on a circuit board, it may also happen that a test finger enters this plated-through hole with its contact tip of thin wire, and is torn off in a further sideways movement of the test finger. This then leads to a failure of the entire tester, generating additional material costs through replacement of the test probe.

SUMMARY OF THE INVENTION

The invention is intended to create a method and a device to reduce considerably or eliminate entirely the problems described above.

This problem is solved by a method with the features of claim 1 and a device with the features of claim 12. Advantageous developments of the invention are given in the relevant dependent claims.

The method according to the invention for the testing of non-componented circuit boards comprises the following steps:
  recording of predetermined areas of a circuit board to be tested by an imaging process
  determination of the form and/or type of circuit board test points lying in the predetermined areas by means of automatic image analysis
  comparison of the determined form and/or type of the circuit board test points with corresponding CAD data for the circuit board, and determination of deviations on the circuit board from the CAD data, and
  testing of the circuit board with a finger tester, in which test fingers of the finger tester are controlled on the basis of the deviations found.

With the method according to the invention, deviations from the CAD data are determined before the actual conduct of a test. In the testing of the circuit board with a finger tester, the test fingers are controlled on the basis of the deviation found, thus avoiding the problems described above. In particular there are no faulty contacts, and no cases of a test needle entering a plated-through hole, leading to possible damage of the test needle.

In recording by the imaging process, preferably image data are obtained from which, in determining the form and/or type of the circuit board test points, image details may be selected which in each case represent one or a predetermined group of circuit board test points, so that the image details may be compared with preset patterns and the type of circuit board test points may be determined with the aid of this pattern comparison.

When the circuit board test point type has been determined, then the form of the circuit board test points may be determined by analysis of the relevant image details. In the present method, the term form also stands for the size of the circuit board test points, which is determined automatically.

Preferably the deviations found are used to correct the CAD data, so that in testing the circuit boards the test fingers may be controlled on the basis of the corrected CAD data.

The imaging method may be an optical method, scanning the surface of the circuit board to be tested by means of an optical sensor, in particular one or more cameras. The imaging method may however also be an electromechanical method, in which the surface of the circuit board to be tested is scanned electrically with a resolution sufficient to generate an image of the surface. Such methods are known for example from U.S. Pat. No. 5,625,297 and DE 40 12 839 B4 respectively or from EP 0 989 409 A1.

The recording of the predetermined areas of the circuit board to be tested by an imaging process may be executed inside a tester. For this purpose, however, it is also possible to provide a separate scanning device, preferably comprising a conventional optical office scanner, which is connected to a device for automatic image analysis, through which the deviations from the CAD data may be determined.

The invention is explained in detail below with the aid of embodiments which are illustrated in the appended drawings. The drawings show in:

DETAILED DESCRIPTION OF THE PREFERRED EMBODIMENT

Figure 1:
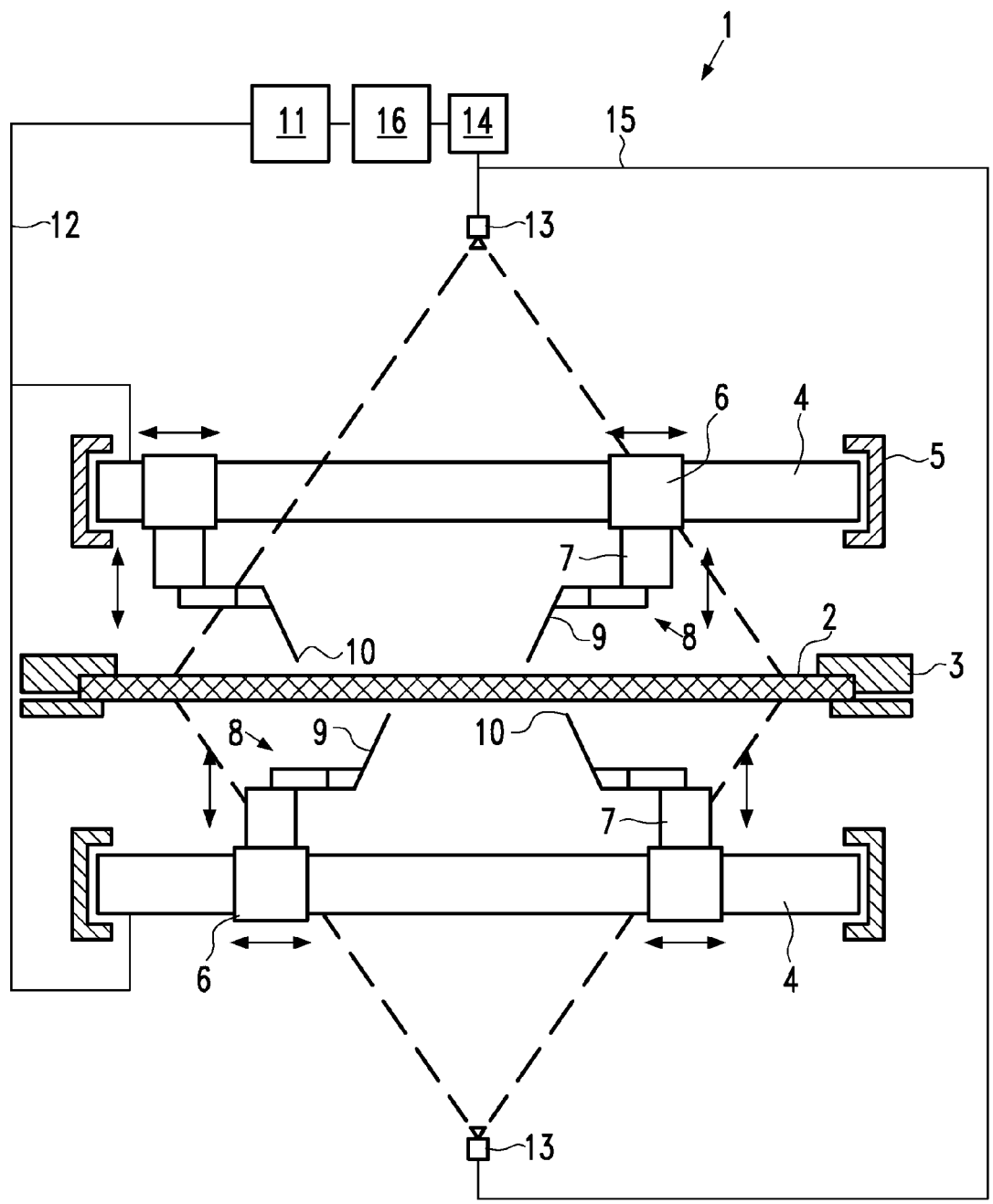
FIG. 1 a device, integrated in a finger tester, for carrying out the method according to the invention, with a camera for scanning the upper side and a camera for scanning the lower side of a circuit board to be tested, in a schematic simplified sectional view, FIG. 2 a device, integrated in a finger tester, for carrying out the method according to the invention, with several cameras, mounted on the test probes, in a schematic simplified sectional view.

A device for carrying out the method according to the invention is shown schematically in FIG. 1. The device is a device 1 for the testing of circuit boards 2, in particular a finger tester 1. The circuit board 2 to be tested is held by a mounting frame 3. This mounting frame 3 bounds a rectangular, smooth-surfaced mounting area for the mounting of a circuit board 2. This mounting area forms a test array in which circuit board test points of a circuit board to be tested may be contacted. Located in the area above and below the mounting area are cross-bars 4, which extend beyond the mounting area. Preferably there are in each case several cross-bars 4 arranged above and below the mounting area and aligned parallel to one another. The cross-bars 4 are held by their ends in rails 5. The rails 5 run at right-angles to the plane of the drawing of FIG. 1, i.e. at right-angles to the cross-bars 4 and parallel to the plane of the mounting area. The cross-bars 4 may be movable in the rails 5.

Mounted on each of the cross-bars 4 in the present embodiment are two slides 6, which may be moved to and fro along the cross-bars 4. On each of the sides of the slides 6 facing the mounting area is mounted a test head 7. On the end of the test head 7 facing the mounting area there is fitted in each case a test probe 8. Each test probe 8 is provided with a test needle 9, each of which has a probe tip 10 facing the mounting area, and by which a circuit board test point of a circuit board 2 to be tested may be contacted. The test head 7 is designed so as to be capable of moving on the slide 6 in a direction at right-angles to the circuit board 2 to be tested and at right-angles to the plane of the mounting area. For this purpose a linear motor may be provided, as for example described in German patent application DE 101 60 119.0. Instead of a linear motor, in principle another control mechanism may be used. The test head 7 may also be provided with a rotating mechanism so that the test probe 8 representing the test finger may be swivelled around an axis at right-angles to the circuit board 2 and to the plane of the mounting area. In such an embodiment, the cross-bars 4 may be made immovable.

The tester 1 has a control unit 11. The control unit 11 is connected by conductors 12 to the control elements, each comprising a slide 6 and a test head 7. The control unit 11 automatically controls movement of the control elements and the test needles 9 for contacting circuit board test points on a circuit board 2 to be tested.

The tester 1 has a detection unit comprising two cameras 13 and an imaging system 14 which is connected to the cameras 13 via conductors 15.

In the present embodiment two cameras are provided, with one of the two cameras 13 being assigned to one of the two surfaces of the circuit board 2 to be tested in such a way that it may scan the surface of the circuit board almost completely. The signals of the cameras 13 are received in the imaging system 14 and combined to form digital images of the circuit board 2.

The imaging system 14 is connected to an evaluation unit 16, to which the images made of the circuit board 2 are transmitted in the form of electronic image files. The recorded images are analysed automatically in the evaluation unit to generate control data for the control unit 11.

In the following embodiment the two cameras 13 are static. According to the invention it is however also possible, instead of a stationary camera, to provide one or more cameras able to slide along cross-bars and mounted independently of the control elements so that the camera or cameras may track and scan the whole surface of the circuit board to be tested.

The mode of operation of the device according to the invention will be explained in detail below with the aid of FIGS. 3, 4a-4e and 5.

Figure 3:
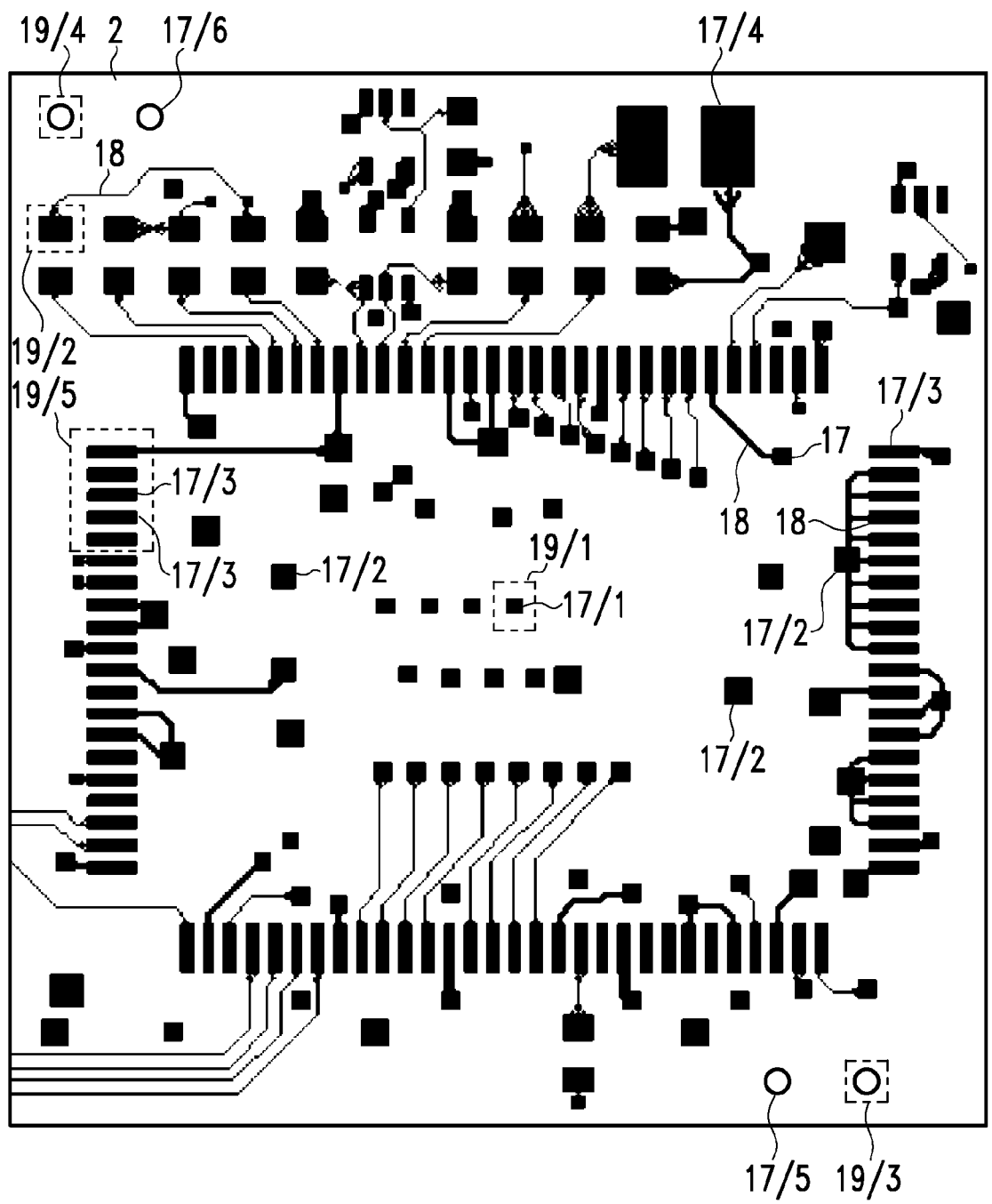
FIG. 3 a detail of a circuit board to be tested, in an enlarged view.

FIG. 3 shows a detail of an image made of a circuit board 2 to be tested. This detail shows circuit board test points 17 of varying type and form, and conductor paths 18 running on the surface of the circuit board 2. The circuit board test points are in the form of pad fields of varying shape, and plated-through holes. Accordingly there are small square pad fields 17/1, larger square pad fields 17/2, strip-like pad fields 17/3, large rectangular pad fields 17/4, plated-through holes with a copper ring 17/5 and plated-through holes without copper ring 17/6. There are also pad fields in the shape of a circle or an oval, also rectangular plated-through holes without and without copper ring. Free-form pad fields are also known; this applies especially to larger pad fields.

The method according to the invention commences with step S1 (FIG. 5) in which a circuit board 2, in particular the first circuit board of a batch of circuit boards to be tested or the first circuit board of a type of circuit board, is inserted in the tester 1.

Next, an image is made of each of the two surfaces of the circuit board 2 to be tested, using the cameras 13 and the imaging system 14 (step S2).

These images are transmitted by the imaging system 14 to the evaluation unit 16. In the evaluation unit 16, the form and/or type of the individual circuit board test points 17 is/are determined (step S3). For this purpose firstly, using an essentially known correlation method, the images are matched with the CAD data of the circuit board to be tested in such a way that, with the aid of the CAD data, the positions in the images at which circuit board test points 17 should be located are determined. At these positions, details 19 of the images are cut out, which also contain a portion of the surroundings of these positions so that, in the event of a shift of the circuit board test point from its required position and/or a modification of its form, it is as far as possible still contained completely in the image detail 19. These image details 19 are compared with relevant patterns. These patterns are each assigned to a type of circuit board test point so that, if a pattern matches an image detail 19, the relevant type of circuit board test point is determined. Thus for example the image detail 19/1 matches the pattern shown in FIG. 4a, which is assigned to the square pad field type of circuit board test point. The image detail 19/2 substantially matches the pattern of FIG. 4b, with the comparison process, which is for example a correlation method or a pruning method, tolerating certain variance due for example to short conductor path segments.

Figure 4A:
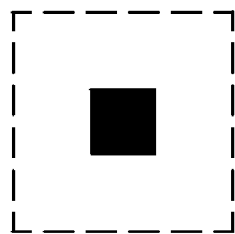
FIGS. 4a-4e in each case patterns for circuit board test points and/or for predetermined layouts of circuit board test points, and FIG. 5 a flow chart of the method according to the invention.
Figure 4B:
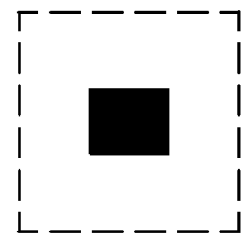
Figure 4C:
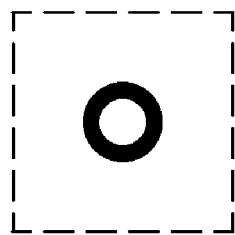
Figure 4D:
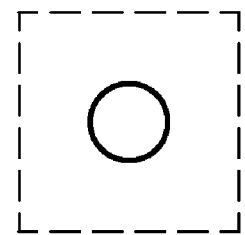
Figure 4E:
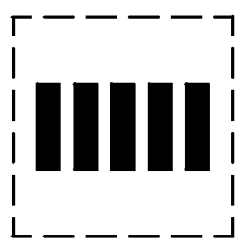
Figure 5:
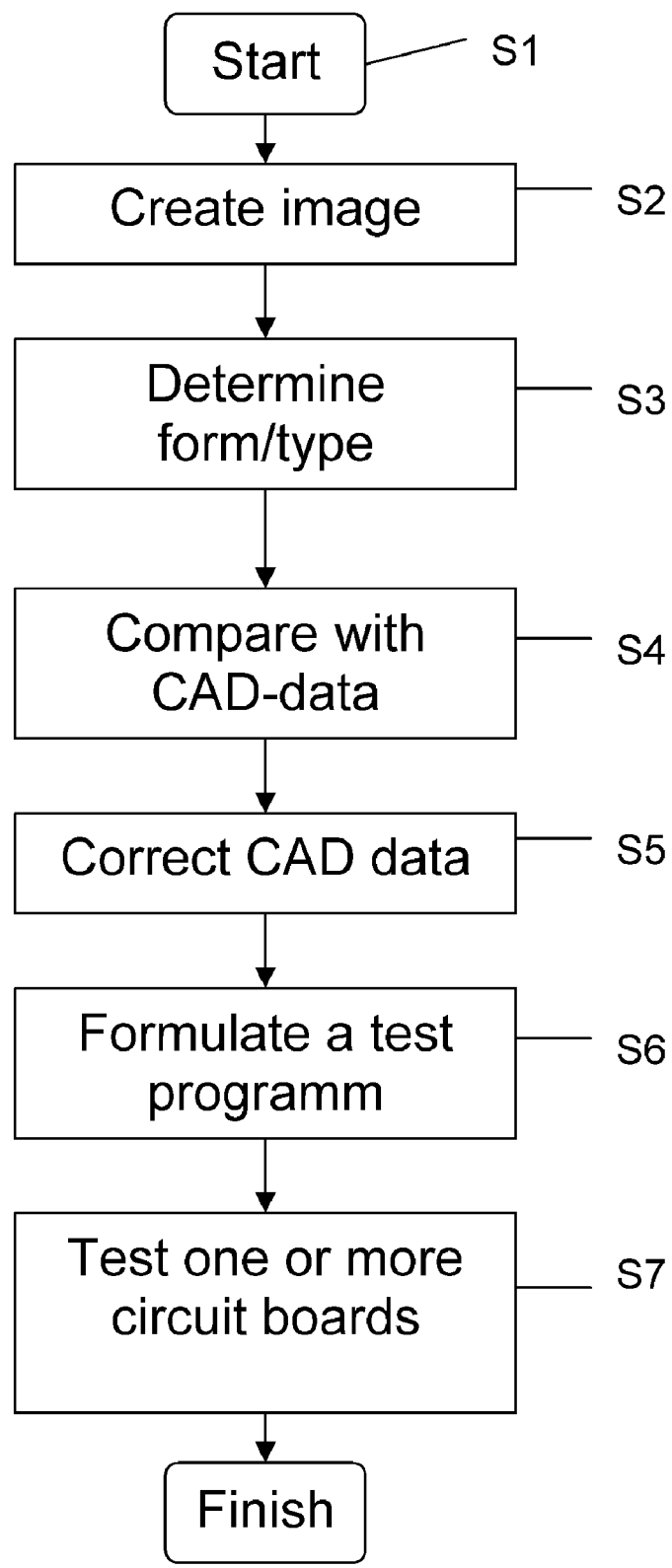

Image detail 19/3 matches the pattern of FIG. 4c, which is assigned to a plated-through hole with copper edge. Image detail 19/4 matches the pattern of FIG. 4d, assigned to a plated-through hole with no copper edge. In this way the types of individual circuit board test points may be identified.

An image detail of this kind may cover one or more circuit board test points. Thus for example the image detail 19/5 has a series of strip-like circuit board test points 17/3. This image detail matches the pattern of FIG. 4e. By this means, several circuit board test point types are identified simultaneously, and a predetermined selection of circuit board test points are identified. Once the type of the individual circuit board test point has been determined, its form may then be more closely analysed and in particular the size of the circuit board test points determined.

In the next step (S4), the circuit board test points thus identified are compared with the CAD data. This involves the recording of deviations.

As soon as all deviations have been determined, the CAD data are corrected in accordance with the deviations recorded (step S5), to the extent that the deviations lie within a predetermined tolerance range. Otherwise the procedure is halted and an error message is output.

The corrected CAD data are then transmitted to the control unit 11. The control unit 11 calculates a test program (step S6) in which it is determined when which circuit board test point of the circuit board to be tested is contacted by which test finger, while the location of the contacting process may also be specified in the program.

The control unit 11 controls the movement of the control elements and of the test needles 9 with the aid of this newly calculated test program, in the testing of the circuit board to be tested (step S7). This test program, thus produced, is used in the testing of several circuit boards, in particular all circuit boards of a batch or all circuit boards of one type. The control of the control elements and of the test needles 9 is thus effected on the basis of the corrected CAD data. This test program produced with the aid of the corrected CAD data is used for testing all circuit boards of a batch or all circuit boards of one type of circuit board.

Instead of calculating a new test program it is also possible, with the aid of the recorded deviations, to produce a correction file, which is added to a test program based on the original uncorrected CAD data. This test program then incorporates this correction file in controlling the control elements and test needles 9, so that control of the test fingers of the finger tester takes place on the basis of the deviations found.

The method has been explained above with the aid of an embodiment in which image details of the recorded image of the circuit board are compared with relevant patterns. Alternatively it is also possible, with the aid of the CAD data, to make a synthetic image of the surface of the circuit board. This synthetic image is described below as the CAD image. The image of the circuit board taken by the imaging process may then be compared in its totality with the CAD image, with deviations between these two images being analysed in the manner explained above, in order to determine the form and/or type of the relevant circuit board test points. Here too, details of the image which differ from the CAD image are compared with relevant patterns.

Figure 2:
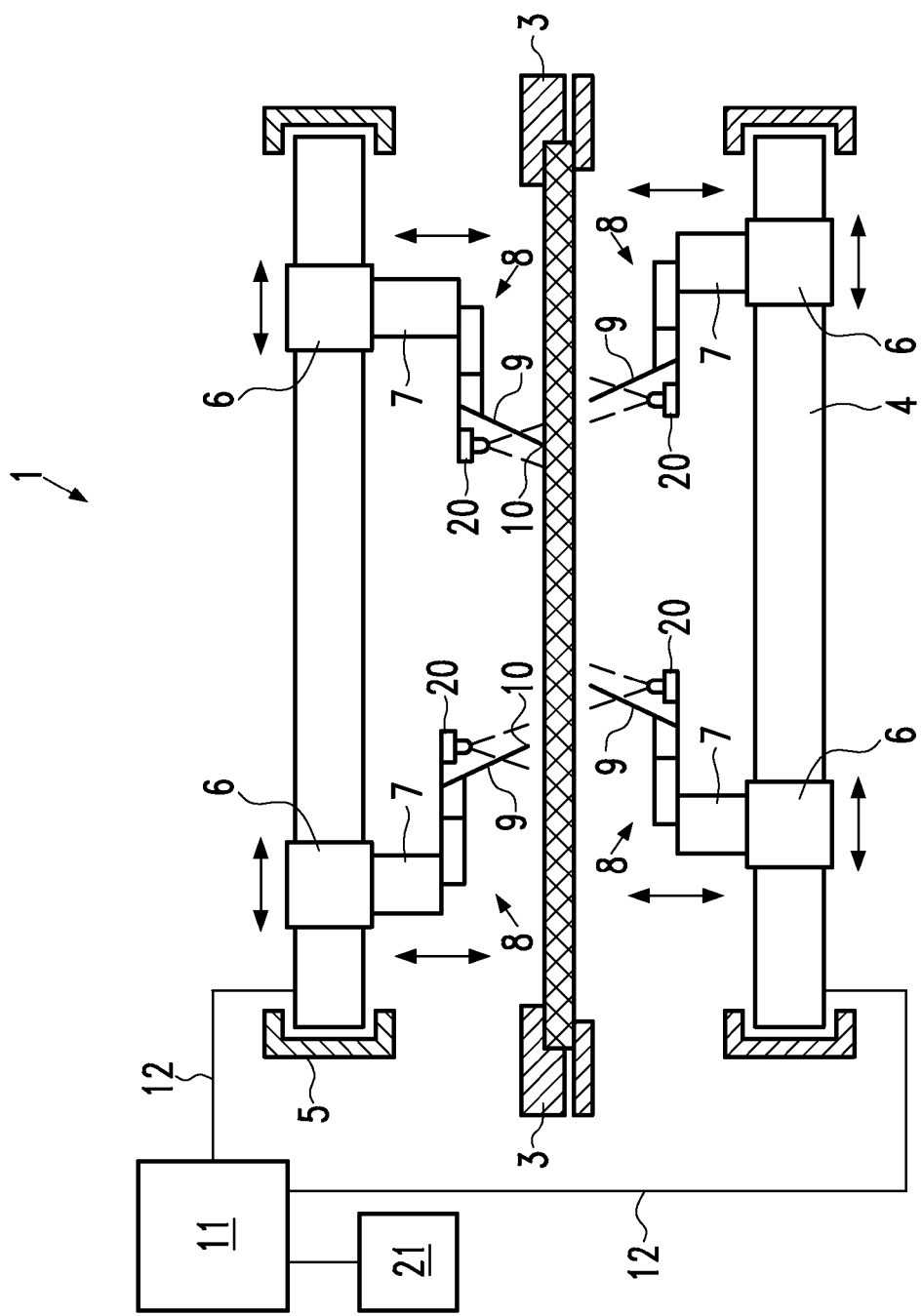

FIG. 2 shows a further embodiment of a tester 1 according to the invention, in which each test probe 8 is provided with a camera 20, by which the surface of a circuit board to be tested may be scanned. A control unit 11 is connected electrically to the control elements (slide 6, test heads 7) and the sensors (camera 20, test needle 9) via conductors 12. Connected to the control unit 11 is a combined imaging/evaluation unit 21. The design of this test device is known from WO 03/096037, to which reference is made in this respect. The method according to the invention is used in the case of this test device in precisely the same way as in the embodiment describe above, with the surface of the circuit board 2 being recorded by the cameras 20 integrated in the test probes 8.

Alternatively it is also possible to scan the surface of a circuit board to be tested with a separate scanning device which is independent of the test device for circuit boards, to analyse the relevant image by an automatic image analysis method, and to compare with the CAD data, in order to determine deviations in predetermined areas. For this purpose a conventional optical scanner may be used to generate an image of the surface of the circuit board to be tested, for transmission to a suitable evaluation unit.

Instead of an optical scanning method, an electromechanical scanning method may also be used. Such an electromechanical scanning method is known for example from DE 40 12 839 B4, in which conductor structures on the surface of the circuit boards to be tested are scanned with test points lying so close together that an image of the surface of the circuit board may be produced from the electrical signals thereby determined. EP 0 989 409 A1 discloses a method in which the surface of a circuit board to be tested is scraped by a probe which has a multiplicity of contact elements fitted to the probe like a brush, so that the surface of the circuit board may be scanned electrically with a very high resolution. Such a probe is also known as a contact brush. An image of the surface of the circuit board may also be generated from these signals. As in the case of the embodiments above, the images produced by such electro-mechanical means may in a similar manner be analysed and compared with the CAD data or with a CAD image.

The predetermined areas of the circuit board recorded by the imaging process may be parts of the circuit board or also the entire surface of the circuit board. Usually, circuit boards are produced by means of several masks, used to expose the metal layers during manufacture. The masks therefore determine the form of the conductor structure. There are also masks for exposing solder resist which is applied to the surface of the circuit board and is also able to bound exposed areas of the conductor structures and so define circuit board test points. It has been found that in the case of deviations from the CAD data, these deviations occur concentrated at circuit board test points which have been produced by one or by just a few masks. It is therefore expedient, with the method according to the invention, to check in each case one circuit board test point defined by each mask. For this purpose, at least those areas of a circuit board to be tested with circuit board test points defined in this way are recorded by the imaging process.

REFERENCE NUMBERS

1 finger tester
2 circuit board
3 mounting frame
4 cross-bar
5 rail
6 slide
7 test head
8 test probe 9 test needle
10 probe tip
11 control unit
12 conductor
13 camera
14 imaging system
15 conductor
16 evaluation unit
17 circuit board test point
18 conductor path
19 detail
20 camera
21 imaging/evaluation unit

What is claimed is:

1. Method for the testing of non-componented circuit boards comprising:
   recording of predetermined areas of a circuit board to be tested by an imaging process;
   determining a form and/or type of circuit board test points lying in the predetermined areas by automatic image analysis;
   comparing the determined form and/or type of the circuit board test points with corresponding computer aided design (CAD) data for the circuit board, and determining deviations of the form and/or type of circuit board test points to be tested from the CAD data, and
   testing of the circuit board with a finger tester, in which test fingers of the finger tester are controlled on the basis of the determined deviations.

2. Method according to claim 1,
   wherein in recording by the imaging process, image data of the predetermined areas of the circuit board to be tested are produced, and firstly in determining the form and/or type of the circuit board test points, image details are selected from these image data which in each case represent one or a predetermined group of circuit board test points, and then these image details are compared with preset patterns and the type of circuit board test points is determined with the aid of this pattern comparison.

3. Method according to claim 2,
   wherein after determining the type of the circuit board test points, the form of the circuit board test points is determined through analysis of the relevant image details.

4. Method according to claim 1,
   wherein the comparison of the image details with the patterns is made by a correlation method.

5. Method according to claim 3,
   wherein the comparison of the image details with the patterns is made by a correlation method.

6. Method according to claim 5,
   wherein with the aid of the determined deviations, the CAD data are corrected, and the corrected CAD data are used to create a test program for controlling the test fingers in testing the circuit board.

7. Method according to claim 6,
   wherein with the aid of the determined deviations, a correction file for a test program is created and used for controlling the test fingers in testing the circuit board.

8. Method according to claim 7,
   wherein an optical method, in which an optical sensor records the predetermined areas of the circuit board to be tested, is used as the imaging method.

9. Method according to claim 8,
   wherein an electro-mechanical method, in which the surface of the circuit board to be tested is scanned electrically at a sufficiently high resolution to produce an image of the surface, is used as the imaging method.

10. Method according to claim 9,
    wherein the recording of the predetermined areas is carried out in the finger tester.

11. Method according to claim 10,
    wherein the recording of the predetermined areas is carried out in a device which is independent of the finger tester.

12. Method according to claim 11, further comprising:
    making circuit boards by using several masks which define the form of the circuit board test points, and the predetermined areas recorded by the imaging method cover at least one circuit board test point defined by the masks.

13. Method according to claim 12,
    wherein the predetermined areas recorded by the imaging method cover all circuit board test points.

14. Method according to claim 1,
    wherein with the aid of the determined deviations, the CAD data are corrected, and the corrected CAD data are used to create a test program for controlling the test fingers in testing the circuit board.

15. Method according to claim 1,
    wherein with the aid of the determined deviations, a correction file for a test program is created and used for controlling the test fingers in testing the circuit board.

16. Method according to claim 1,
    wherein an optical method, in which an optical sensor records the predetermined areas of the circuit board to be tested, is used as the imaging method.

17. Method according to claim 1,
    wherein an electro-mechanical method, in which the surface of the circuit board to be tested is scanned electrically at a sufficiently high resolution to produce an image of the surface, is used as the imaging method.

18. Method according to claim 1,
    wherein the recording of the predetermined areas is carried out in the finger tester.

19. Method according to claim 1,
    wherein the recording of the predetermined areas is carried out in a device which is independent of the finger tester.

20. Method according to claim 1, further comprising:
    making circuit boards by using several masks which define the form of the circuit board test points, and the predetermined areas recorded by the imaging method cover at least one circuit board test point defined by the masks.

21. Method according to claim 1,
    wherein the predetermined areas recorded by the imaging method cover all circuit board test points.

22. Method according to claim 1,
    wherein the recording of the predetermined areas by automatic image analysis, determining of the form and/or type of circuit test point, and comparing the determined form and/or type with corresponding CAD data, are completed before tests of the circuit board test points are conducted with test fingers.

23. Method according to claim 1,
    wherein determining the form and/or type of the circuit board test points by automatic image analysis also includes determining the size of the circuit board test points.

24. Method according to claim 1,
    wherein recordings of image details are compared to preset patterns and multiple circuit board test points are identified simultaneously.

25. Method according to claim 1,
    wherein determining the form and/or type of the circuit board test points by automatic image analysis includes determining whether the form and/or type of the circuit board test point is a pad field or plated-through hole.

26. Method according to claim 1,
wherein determining the form and/or type of the circuit board test points by automatic image analysis also includes determining whether the form and/or type of the circuit board test point is rectangular or circular.

27. Device for testing of non-componented circuit boards comprising
a unit recording predetermined areas of a circuit board to be tested by an imaging process, and
an evaluation unit
determining the form and/or type of circuit board test points lying in the predetermined areas by means of automatic image analysis,
comparing of the determined form and/or the determined type of the circuit board test points with corresponding CAD data for the circuit board, and
determining deviations on the form and/or type of circuit board test points to be tested from the CAD data, and
test fingers which are controlled on the basis of the deviations found by the evaluation unit.

28. Device according to claim 27,
wherein the evaluation unit performs a correlation on the CAD data.

29. Device according to claim 27,
wherein the unit for recording predetermined areas of a circuit board to be tested using an imaging method has an optical sensor.

30. Device according to claim 27,
wherein the unit for recording predetermined areas of a circuit board to be tested using an imaging method has an electrical sensor with several contact elements.

31. Device according to claim 30,
wherein the sensor is a contact brush.

32. Device according to claim 27,
wherein the device is part of a finger tester.

33. Device according to claim 27,
wherein the device is equipped with a control unit for controlling the test fingers.

34. Device according to claim 27,
wherein determining the form and/or type of the circuit board test points by automatic image analysis also includes determining the size of the circuit board test points.

35. Device according to claim 27,
wherein determining the form and/or type of the circuit board test points by automatic image analysis includes determining whether the form and/or type of the circuit board test point is a pad field or plated-through hole.

36. Device according to claim 27,
wherein determining the form and/or type of the circuit board test points by automatic image analysis also includes determining whether the form and/or type of the circuit board test point is rectangular or circular.

* * * * *